United States Patent [19]

Suzuki et al.

[11] Patent Number: 4,841,342

[45] Date of Patent: Jun. 20, 1989

[54] APPARATUS FOR TREATING PHOTORESISTS

[75] Inventors: Shinji Suzuki, Kawasaki; Tetsuji Arai, Yokohama; Kuniharu Ohno, Miyashiro; Kazuyeshi Ueki, Kawasaki; Yoshiki Mimura; Kazuya Tanaka, both of Yokohama; Shinji Sugioka, Kakogawa; Hiroko Suzuki, Kawasaki, all of Japan

[73] Assignee: Ushio Denki, Tokyo, Japan

[21] Appl. No.: 192,994

[22] Filed: May 12, 1988

Related U.S. Application Data

[62] Division of Ser. No. 923,553, Oct. 17, 1986.

[30] Foreign Application Priority Data

Mar. 13, 1986 [JP] Japan .................................. 61-53626

[51] Int. Cl.⁴ .............................................. G03B 27/72
[52] U.S. Cl. .......................................... 355/71; 355/53
[58] Field of Search ...................... 355/53, 67, 71, 85

[56] References Cited

U.S. PATENT DOCUMENTS

| | | | |
|---|---|---|---|
| 3,573,456 | 4/1971 | Beeh | 355/71 |
| 4,589,769 | 5/1986 | Matsuki | 355/71 |
| 4,732,842 | 3/1988 | Kira | 355/53 |

Primary Examiner—Monroe H. Hayes
Attorney, Agent, or Firm—Armstrong, Nikaido, Marmelstein, Kubovcik & Murray

[57] ABSTRACT

Ultraviolet radiation process applicable in the manufacture of semiconductor devices to enhance the thermal stability of a photoresist film on a semiconductor wafer.

A method, in ultraviolet radiation process, and an apparatus enabling the high-speed and effective treatment of a photoresist pattern employing ultraviolet irradiation by preventing the deformation of the photoresist which is caused by the light radiated from a discharge lamp such as high pressure mercury vapor lamp. This method and apparatus employ ultraviolet irradiation, in which ultraviolet rays are applied to the photoresist pattern, using a means to intercept or reduce selectively all or part of the wavelengths in the spectral response region of the photoresist out of radiant energy obtained from the discharge lamp.

7 Claims, 2 Drawing Sheets

APPARATUS FOR TREATING PHOTORESISTS

This is a division of application Ser. No. 923,553 filed Oct. 17, 1986.

BACKGROUND OF THE INVENTION

1. Field of the Invention

This invention relates to a method and an apparatus of treating photoresist materials applied on semiconductor wafer and, more particularly, to a method and an apparatus of treating the photoresist materials employing ultraviolet irradiation.

2. Description of the Prior Art

As for the prior-art treatment of a photoresist employing ultraviolet irradiation, exposing the photoresist to ultraviolet radiation is utilized in a treatment in which a mask pattern is formed by exposing the photoresist applied on a semiconductor wafer, in a preliminary cleansing treatment in which organic pollutants sticking on the surface of the semiconductor wafers are dissolved and cleansed away, etc., and recently attention has been paid to the application of this method to particular treatments of photoresists such as baking photoresist materials.

The baking process is an intermediate between a process of forming a photoresist pattern by applying, exposing and developing the photoresist and a process of executing ion implantation, plasma etching, etc. by using the photoresist pattern, and it is a heating process executed for improving the adhesiveness of the photoresist to a semiconductor substrate, heat resistance, etc. Studies have been made recently on a method in which ultraviolet rays are applied to the photoresist before or during the baking process after development so as to enhance the heat resistance and plasma resistance of the photoresist through the baking process in a shorter time.

When a light having a high ultraviolet intensity, such as a radiant light from a discharge lamp such as high pressure mercury vapor lamp having a high ultraviolet radiation efficiency, is applied to the photoresist to expedite the treatment, however, a gas is generated from the photoresist, and this gas causes the formation of bubbles, deformation of a photoresist pattern and breakdown of a photoresist film, such as exfoliation, rupture or roughening thereof, thus causing imperfections of a semiconductor element.

It can be supposed that the generation of this gas is caused by a rapid photochemical reaction of the light sensitive radicals of the photoresist, by the photochemical reaction of HMDS (hexamethyldisilazine), which is applied to a wafer as a preliminary treatment for the application of the photoresist, or an antireflection coating, etc. on the photoresist, by the photochemical reaction of an additive to the photoresist such as dyestuff, by the photochemical reaction of a solvent remaining in the photoresist, etc.

These photochemical reactions are advanced remarkably by a light having a wavelength 300 nm to 500 nm, and more particularly, by a light having a wavelengths in the spectral response region of the photoresist. Accordingly, when a discharge lamp such as high pressure mercury vapor lamp radiating a light including these wavelength areas is employed the intensity of light cannot be enhanced. In other words, this apparatus has a problem that it cannot perform a high-speed treatment.

SUMMARY OF THE INVENTION

An object of this invention is to provide a method and an apparatus enabling the high-speed and effective treatment of the photoresist employing ultraviolet irradiation by preventing the deformation of the photoresist which is caused by the light radiated from the discharge lamp such as high pressure mercury vapor lamp.

Ultraviolet rays are applied to the photoresist, using a means to intercept or reduce selectively all or part of the wavelengths in the spectral response region of the photoresist out of radiant lights obtained from the discharge lamp such as high pressure mercury vapor lamp.

In this way, the photochemical reactions causing the generation of the gas from the photoresist are curbed and thus the deformation of the photoresist is prevented, even when a discharge lamp such as a high pressure mercury vapor lamp radiating strongly light in the wavelength area exerting destructive actions on the photoresist together with ultraviolet rays being effective for improving the heat resistance and plasma-etching resistance of the photoresist is employed, since the light in the wavelength area exerting the said destructive actions is not applied onto the photoresist, or since the intensity of this light is weak sufficiently even if it is applied.

Moreover, the light applied to the photoresist still contains a strong ultraviolet component being effective for improving the heat resistance and plasma-etching resistance of the photoresist even when the wavelengths in the spectral response region of the photoresist are intercepted or reduced.

Accordingly, a method enabling the high-speed and effective treatment of the photoresist is accomplished.

Other objects and advantages of this invention will become apparent from the following description of the preferred form of the invention which is illustrated in the drawings accompanying and forming part of this specification.

DESCRIPTION OF THE PREFERRED EMBODIMENT

This invention will be described concretely hereinafter on the basis of embodiments shown in drawings.

Figure 1:
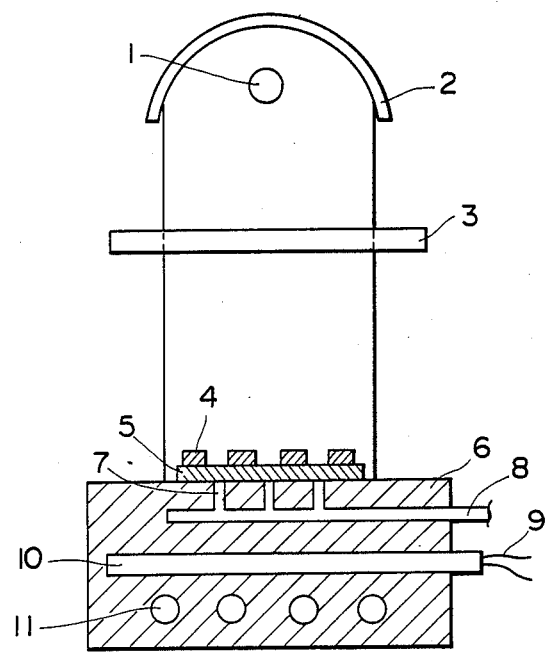
FIG. 1 shows an apparatus of treating a photoresist pattern for explaining one embodiment of a method of treating a photoresist pattern according to this invention.

FIG. 1 shows an embodiment of an apparatus of treating a photoresist pattern for explaining one embodiment of a method for treatment of photoresist pattern according to this invention.

A pattern of a photoresist 4 is formed on a semiconductor wafer 5, which is placed on a support 6. The support 6 is heated by a heater 10 connected with power supply through a heater lead wire 9, or cooled down by cooling water flowing through a cooling conduit 11. The temperature of the semiconductor wafer 5 is controlled by these heating and cooling mechanisms. Moreover, the support 6 is provided with vacuum adsorption holes 7, a function of which is to fix the semiconductor wafer 5 on the support 6 in close contact with it by the vacuum adsorption connected with a vacuum pump through a connecting conduit 8. A part of ultraviolet irradiation is composed of a high pressure mercury vapor lamp 1, a concave mirror 2, a filter 3, etc.

Figure 3:
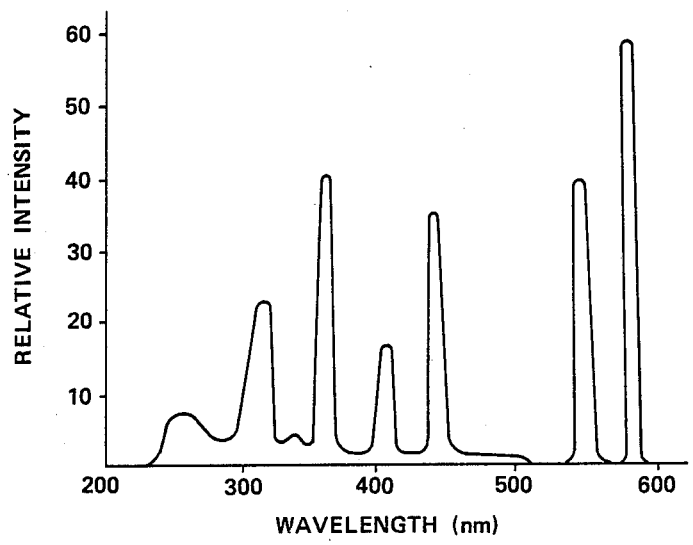
FIG. 3 shows one example of the radiation spectrum of the electrodeless discharge lamp employed in this invention.
Figure 4:
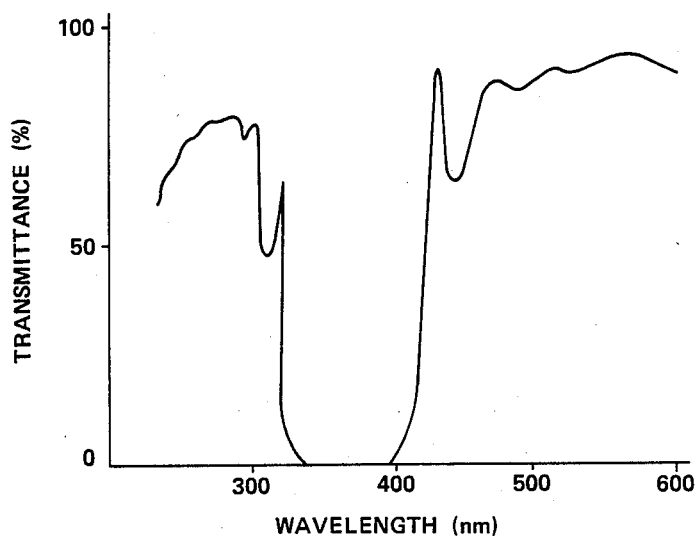
FIG. 4 shows one example of the spectral transmittance characteristics of the filter employed in this invention.

The radiant light from the high pressure mercury vapor lamp 1 is passed through the filter 3 etc. and applied to the photoresist pattern 4. FIG. 3 shows one example of the radiation spectrum of the high pressure mercury vapor lamp 1 employed in this embodiment. As for the filter 3, a filter intercepting or reducing a light in the wavelength area of 300 nm to 500 nm, that is, a wavelength area including the wavelengths in the spectral response region of the photoresist, is employed herein, and thereby the treatment of the photoresist pattern employing ultraviolet irradiation can be performed effectively.

It is suitable to employ a fitler prepared by forming a multilayer evaporation film on a glass plate, for obtaining the characteristic of intercepting or reducing the light in the wavelength area of 300 nm to 500 nm. The glass plate preferable for this filter is of silica glass showing a large transmittance of ultraviolet rays of a wavelength 300 nm or below which are effective for the improvement in the heat resistance and plasma-etching resistance of the photoresist.

By using this apparatus, the radiant light from the high pressure mercury vapor lamp is applied to a sample which was prepared by using HPR-1182, OFPR-800, OFPR-5000 and TSMR-8800 as the photoresist, and HMDS as an agent which is applied to a wafer as a preliminary treatment for the application of the photoresist. While deformation took place in any samples of photoresists pattern when the aforesaid filter was not employed, no deformation of the photoresist pattern occurred and the heat resistance plasma-etching resistance of the photoresist pattern were improved when this filter was employed so as to intercept the light wavelengths of 300 nm to 500 nm.

A high pressure mercury vapor lamp radiates strongly light having wavelengths of 312 nm, 365 nm, 405 nm and 436 nm. When this lamp and a narrow-band filter intercepting these wavelengths of light are employed, no deformation of the photoresist occurred, too.

Figure 2:
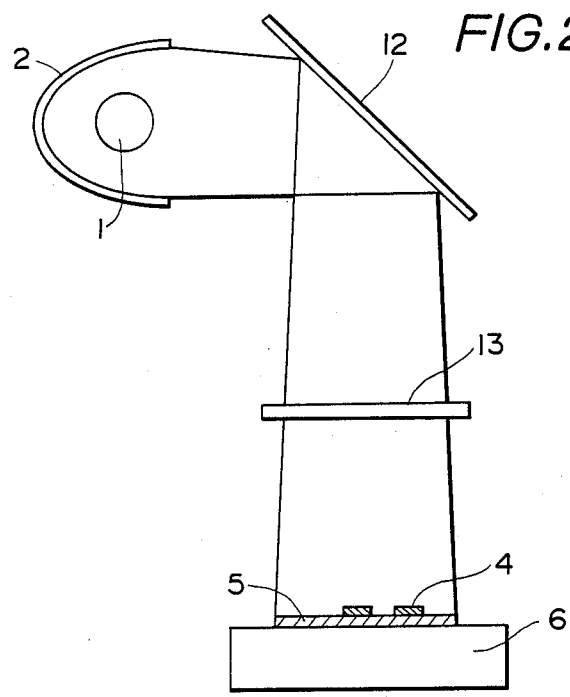
FIG. 2 shows another apparatus of treating a photoresist pattern for explaining another embodiment.

FIG. 2 shows another embodiment in which a mirror is employed as a means to intercept or reduce the radiant light in the wavelength area of 300 nm to 500 nm. The mirror 12 employed herein has a characteristic of reflecting a radiant light in a wavelength area below 300 nm and not reflecting the radiant light of 300 nm to 500 nm. A mirror formed by evaporation of a multilayer film is suitable for the mirror having the above-mentioned characteristic. The same effect as in the apparatus illustrated in FIG. 1, in which the filter is employed, can be attained also in the apparatus illustrated in FIG. 2, in which the mirror having the said characteristic is employed. When a conventional mirror reflecting the whole of the radiant light from the high pressure mercury vapor lamp is employed in place of the mirror having the aforesaid characteristic, deformation took place in the aforesaid samples of the photoresist pattern.

In the above-mentioned embodiment, a high pressure mercury vapor lamp is used to enable the radiation of ultraviolet lights of high intensity. This lamp is not limited thereto. A metal-halide discharge lamp containing a filling comprised of a very small quantity of metal other than mercury in the form of a halide, for instance, may be used as well on condition that the lamp radiates ultraviolet rays of a prescribed wavelength, and further mercury and rare gas discharge lamps containing a filling comprised of mercury and a rare gas may also be employed.

In the above-described embodiments, in addition, the filter or the mirror is employed separately as a means to intercept or reduce light having the wavelengths in the spectral response region of the photoresist. It is a matter of course that a combination of filters and mirrors may be employed.

What is claimed:

1. Apparatus for treating a photoresist pattern on a semiconductor wafer to enhance thermal stability of said pattern comprising:
   a support,
   means for holding a semiconductor wafer on said support,
   a discharge lamp for radiating energy of wavelengths in the ultraviolet range,
   means for directing said radiant energy of ultraviolet wavelengths from said discharge lamp to a photoresist pattern formed on a semiconductor wafer supported on said support, and
   means interposed between said discharge lamp and said photoresist pattern for selectively filtering wavelengths in the 300 nm to 500 nm spectral response region of said photoresist pattern from said radiant energy, such that treating of said photoresist pattern is accomplished only by ultraviolet radiation components other than wavelengths in said spectral response region.

2. The apparatus according to claim 1, wherein said means for selectively filtering wavelengths in the spectral response region of said photoresist pattern from said radiant energy is comprised of a filter prepared by forming a multi-layer evaporation film on a glass plate.

3. The apparatus according to claim 2, wherein said glass plate is comprised of silica glass.

4. The apparatus according to claim 1, wherein said means for selectively filtering wavelengths in the spectral response region of said photoresist pattern from said radiant energy is comprised of a mirror.

5. The apparatus according to claim 4, wherein said mirror is comprised of a mirror formed by evaporation of a multilayer film on a plate.

6. The apparatus according to claim 1, wherein said means for selectively filtering wavelengths in the spectral response region of said photoresist pattern from said radiant energy is comprised of a combination of a filter and a mirror.

7. The apparatus defined by claim 1, wherein said discharge lamp is a mercury vapor lamp.

* * * * *